United States Patent
Mostafazedeh et al.

(10) Patent No.: US 6,707,148 B1
(45) Date of Patent: Mar. 16, 2004

(54) BUMPED INTEGRATED CIRCUITS FOR OPTICAL APPLICATIONS

(75) Inventors: Shahram Mostafazedeh, San Jose, CA (US); Joseph O. Smith, Morgan Hill, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/153,269

(22) Filed: May 21, 2002

(51) Int. Cl.[7] ............................................... H01L 23/48
(52) U.S. Cl. ..................... 257/704; 257/749; 257/432
(58) Field of Search ................................. 257/749, 704, 257/431, 432, 433, 434, 440; 174/52.1; 361/783, 820

(56) References Cited

U.S. PATENT DOCUMENTS

| | | | |
|---|---|---|---|
| 5,949,655 A | * | 9/1999 | Glenn ........................ 361/783 |
| 6,034,429 A | * | 3/2000 | Glenn et al. ................ 257/701 |
| 6,163,866 A | | 12/2000 | Ansari ........................ 714/734 |
| 6,191,359 B1 | * | 2/2001 | Sengupta et al. ........... 174/52.3 |
| 6,204,556 B1 | * | 3/2001 | Hakamata ................... 257/728 |
| 6,396,116 B1 | * | 5/2002 | Kelly et al. ................. 257/432 |
| 6,441,481 B1 | * | 8/2002 | Karpman .................... 257/711 |
| 6,489,675 B1 | * | 12/2002 | Greber et al. ............... 257/698 |

* cited by examiner

*Primary Examiner*—Kamand Cuneo
*Assistant Examiner*—Lourdes Cruz
(74) *Attorney, Agent, or Firm*—Beyer Weaver & Thomas, LLP.

(57) ABSTRACT

An optical integrated circuit application where the integrated circuit is packaged in a clear molding material and is attached to a printed circuit board having an aperture is described. The integrated circuit senses and/or emits light through the clear molding material and through the aperture in the printed circuit board.

13 Claims, 3 Drawing Sheets

BUMPED INTEGRATED CIRCUITS FOR OPTICAL APPLICATIONS

CROSS-REFERENCE TO RELATED APPLICATIONS

This application is related to U.S. patent application Ser. No. 09/620,206, filed Jul. 19, 2000, entitled "METHOD TO ENCAPSULATE BUMPED INTEGRATED CIRCUIT TO CREATE CHIP SCALE PACKAGE", and to U.S. patent application Ser. No. 09/957,936, filed Sep. 21, 2001, entitled "Technique for Protecting Photonic Devices in Optoelectronic Packages with Clear Overmolding," the contents of which are hereby incorporated by reference.

FIELD OF THE INVENTION

The present invention relates generally to integrated circuits, and more specifically to integrated circuits for optically related applications.

BACKGROUND OF THE INVENTION

Integrated circuits can be used in optically related applications such as sensor and optoelectronic signal transmission applications. Such integrated circuits contain devices for sensing and detecting light. As in most integrated circuit applications, the integrated circuit chips are packaged in a protective casing that allows the chip to be connected with an electrical system. For exanple, chips are commonly packaged in casings that have conductive leads that connect the chips to external systems such as printed circuit boards. With optical applications however, the packaging needs to allow light to reach the light sensing and/or detecting devices on an integrated circuit chip. One technique for allowing light to reach a chip is to mount the chip within a cavity of a package and then enclose the chip within the cavity with a plate of glass or clear plastic. This type of packaging is shown in FIGS. 1 and 2. FIG. 1 is a top plan view an optical device package 100 as is currently known, which includes a case 102 having a cavity and a transparent plate 104. FIG. 2 is a side-plan cross-sectional view of optical device package 100 of FIG. 1 along line 2—2. An integrated circuit chip 106 is mounted inside the cavity 108 of case 102 and is electrically connected to case 102 through interconnecting wires 110. Transparent plate 104 allows light to enter package 100 and reach the optical devices formed on the surface of chip 106. Electrical vias embedded within case 102 connect interconnecting wires 110 to electrical contacts on the external surfaces of case 102 so that contact with an external system can be made. An example of package 100 of FIGS. 1 and 2 is a ceramic cavity package where case 102 is made of a ceramic material. Unfortunately, packages resembling package 100 have certain drawbacks. First of all, the transparent plate and case are expensive, especially when the case is formed of ceramic. Secondly, it is also expensive to implement the specialized manufacturing processes related to placing the transparent plate onto the case. Finally, this packaging configuration usually is relatively large in size and therefore is less amenable for use in small-scale applications.

A second technique for packaging optical integrated circuit chips is to encase the chips in typical packaging form factors using clear molding material. Such typical form factors include QFP, TSSOP, DIP, etc. In many of these packaging form factors, the chip is wire bonded to the contact leads. Unfortunately, clear molding material has a higher coefficient of thermal expansion (CTE) than that of typical opaque molding material. Therefore, during heating and cooling processes, the large CTE causes the clear molding material to tear apart the connections made between the interconnecting wires and the bond pads on the chip or the contact leads. This leads to defective optical components that cannot be utilized.

In view of the foregoing, a technique for packaging optical integrated circuits within a structurally sound, cost-effective package having a small form factor would be desirable.

BRIEF SUMMARY OF THE INVENTION

The present invention is directed to an optical integrated circuit application where the integrated circuit is packaged in a clear molding material and is attached to a printed circuit board having an aperture. The integrated circuit senses and/or emits light through the clear molding material and the aperture in the printed circuit board. The present invention can be utilized in various electronic and optical applications that include optical sensor, optical signal transmission, and digital camera applications.

As an apparatus, the present invention includes at least a packaged integrated circuit and an electrical substrate. The packaged integrated circuit includes an integrated circuit having a set of light emitting or sensing devices and a plurality of bond pads formed thereupon, a conductive bump formed on each of the respective bond pads, and a clear molding material that encapsulates the integrated circuit and a portion of each conductive bump. Light can pass through the clear molding material and reach the set of light emitting or sensing devices. The electrical substrate has a plurality of electrical contact points and an aperture wherein the packaged integrated circuit is positioned on the electrical substrate wherein the aperture is located above the set of light emitting or sensing devices. In another embodiment of the invention, the integrated circuit contains more than one set of light emitting or sensing devices and the electrical substrate has a corresponding aperture for each set of devices.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known operations have not been described in detail so not to unnecessarily obscure the present invention.

The present invention pertains generally to an optical integrated circuit application where the integrated circuit is packaged in a clear molding material and is attached to a printed circuit board having an aperture. The integrated circuit senses and/or emits light through the clear molding material and through the aperture in the printed circuit board. This apparatus configuration has a small form factor and is easily manufactured. The present invention can be utilized in various electronic and optical applications that include optical sensor, optical signal transmission, and digital camera applications.

Figure 1:
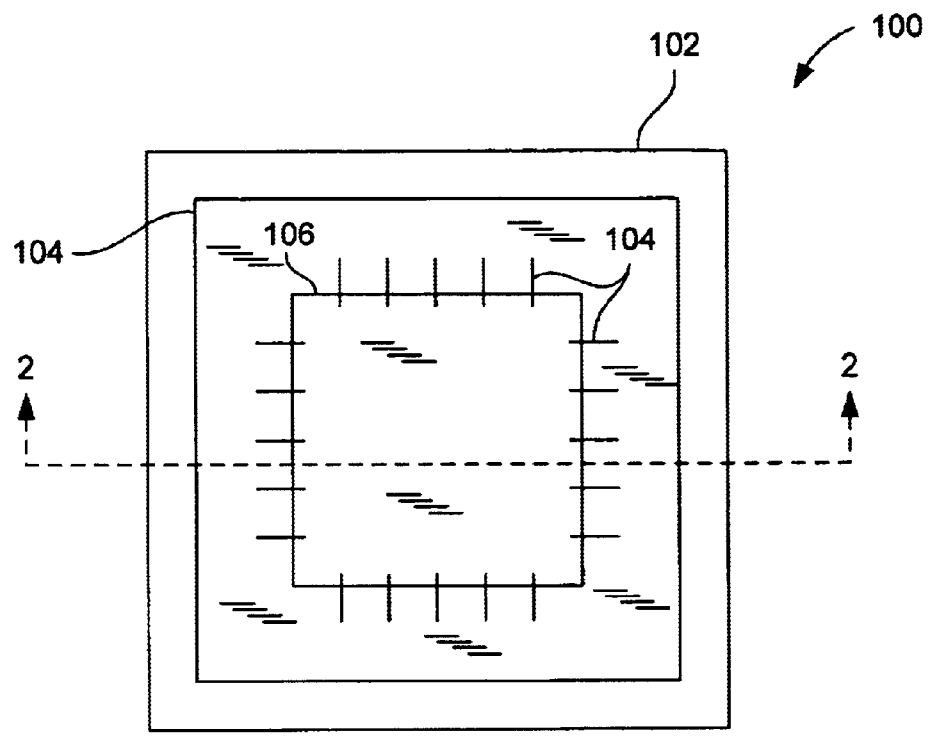
FIG. 1 is a top plan view an optical device package as is currently known, which includes a case, which has a cavity, and a transparent plate.
Figure 2:
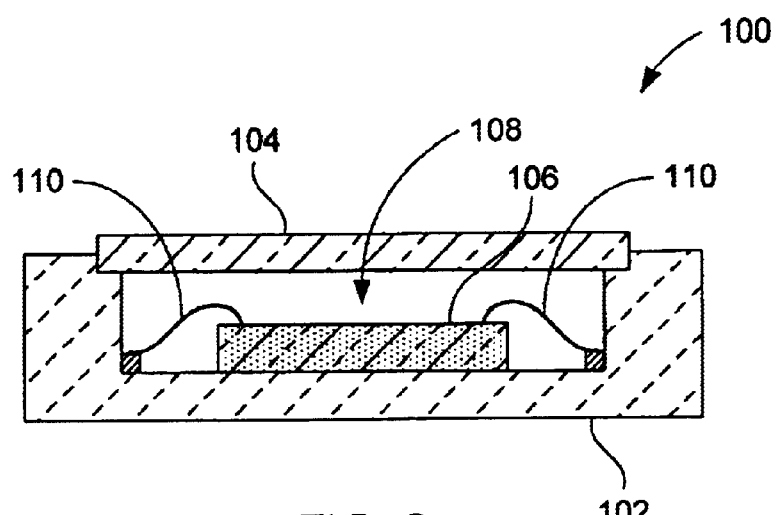
FIG. 2 is a side-plan cross-sectional view of the optical device package of FIG. 1 along line 2—2.
Figure 3:
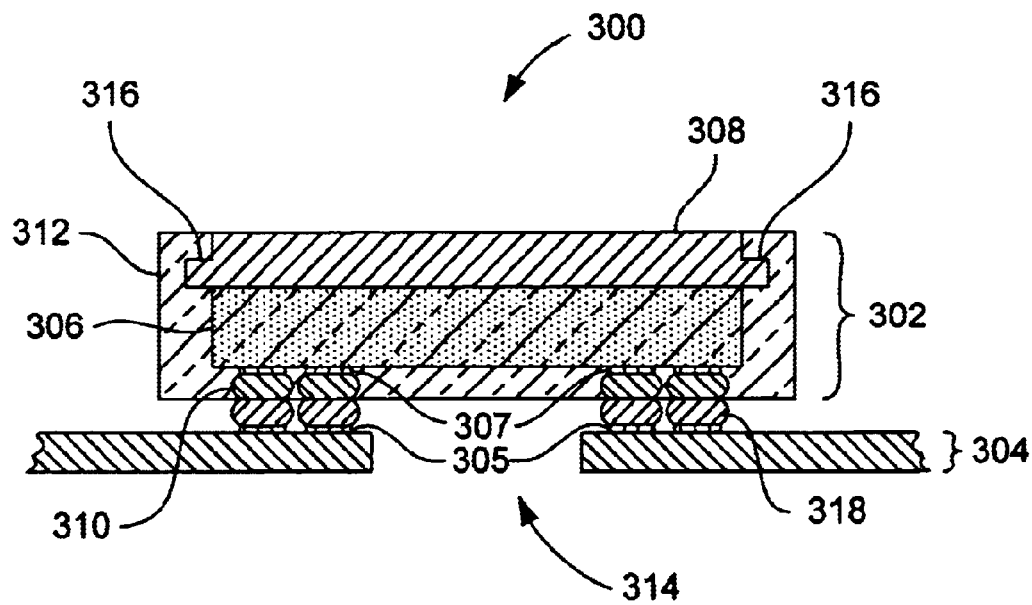
FIG. 3 illustrates a side-plan, cross-sectional view of an optoelectronic device according to one embodiment of the present invention.

FIG. 3 illustrates a side-plan, cross-sectional view of an optoelectronic device 300 according to one embodiment of the present invention. Optoelectronic device 300 includes a packaged integrated circuit (IC) device 302 that is attached to an electrical substrate 304. Packaged IC device 302 includes a semiconductor die 306 that is attached to a metal pad 308, and conductive bumps 310, all of which are at least partially encapsulated within a clear molding material 312. The electrical substrate 304 has an aperture 314 through which light can pass through the plane of substrate 304 and reach packaged IC device 302.

Semiconductor die 306 has devices formed on its surface that are capable emitting, detecting, or emitting and detecting light. Die 306 can have one or more sets of these devices so that multiple light signals can be received and transmitted. Die 306 can be configured to be a transmitter, receiver, or transceiver. These light sensing or transmitting devices are formed on the bottom surface of die 306 which faces aperture 314 of substrate 304. In this way, light can pass through aperture 314 and clear molding material 312 to reach die 306. Die 306 also has bond pads 307 formed on its bottom surface. Conductive bumps 310 are formed on bond pads 307 and provide an electrical pathway to connect die 306 to systems outside of clear molding material 312. Conductive bumps 310 can be formed of materials such as solder or gold. Die 306 can have varying numbers of conductive bumps 310 formed on its bottom surface depending upon the specific requirements of the die.

Clear molding material 312 is used so that light signals can pass through it and reach the light emitting or transmitting devices formed on die 306. Therefore, clear molding material can be any of a variety of materials so long as light signals can substantially pass through.

Metal pad 308 is attached to the top surface of die 306, usually with an adhesive material such as epoxy. Metal pad 308 is typically made out of copper, however, various metals and even non-metals can be used. Metal pad 308 blocks out light that may reach die 306 from the topside of package 302. Metal pad 308 can also serve as a heat sink that dissipates heat from die 306. If required, additional heat sinks can be attached to the top surface of metal pad 308. Metal pad 308 has locking ledges 316 that serve to lock pad 308 within molding material 312. In some embodiments, locking ledges 316 are optional and are not included with metal pad 308. In some embodiments, metal pad 308 need not be included within device 302.

In some manufacturing processes, metal pad 308 is supplied in a sheet that contains an array of metal pads. This sheet of metal pads allows packaged device 302 to be mass manufactured. This process typically involves attaching a bumped semiconductor die to each of the metal pads. Then blocks of clear molding material are formed around one or more of the dice while making sure to leave the conductive bumps exposed through the molding material. Finally, the sheet is sawed into individual packaged devices. For more detail related to the method of manufacturing packaged device 302, refer to U.S. patent application Ser. No. 09/620,206.

Packaged device 302 utilizes a semiconductor die that is sometimes referred to as a "flip chip." Flip chips are chips that have their bond pads directly attached (through a conductive medium such as a conductive bump) to another electrical device or substrate. Flip chips typically have conductive bumps, such as conductive bump 310, that provide the conductive path to form a connection with an external device. Conductive bumps withstand the expansion and contraction of the molding material that takes place during heating and cooling steps of manufacturing better than wire bonded interconnecting wires.

Solder bumps 318 are used to connect conductive bumps 310 of packaged device 302 to electrical contact points 305 on substrate 304. Solder bumps 318 can be substituted for by various other conductive materials, such as gold or epoxy.

Electronic substrate 304 can be a variety of substrates that include typical FR4 printed circuit boards or flexible circuit substrates. Essentially, substrate 304 contains electrical circuitry that connects device package 302 to another electrical device or system. Aperture 314 is positioned and sized so that the light emitting and detecting circuitry on the bottom surface of die 306 is exposed through substrate 304. In this way, packaged device 302 can be properly utilized in optical applications. Light reaches the bottom surface of die 306 by passing through aperture 314 and through clear molding material 312. In most embodiments, aperture 314 is sized to expose the light emitting and detecting devices through substrate 304. At the same time aperture 314 should cover the portion of the integrated circuitry that does not emit or transmit light so that leakage current due to light exposure is reduced.

Figure 4:
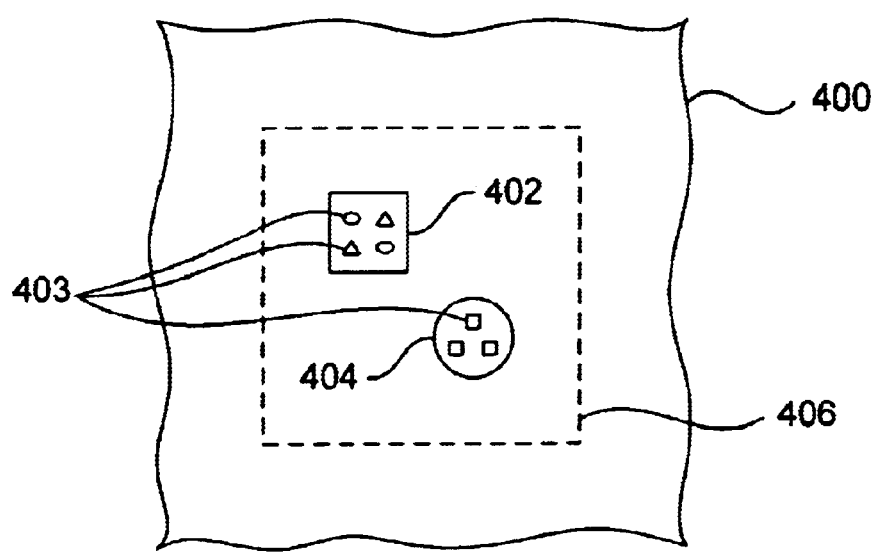
FIG. 4 illustrates a bottom-plan view of an electronic substrate having two apertures according to an alternative embodiment of the present invention.

FIG. 4 illustrates a bottom-plan view of an electronic substrate 400 having two apertures 402 and 404 according to an alternative embodiment of the present invention. The dashed-line outline 406 represents the packaged device that is attached to the opposite surface of electronic substrate 400. The packaged device contains a die that has at least two sets of light emitting and detecting devices 403. Aperture 402 has a square shape and aperture 404 has a circle shape. Each aperture is shaped to expose the light emitting and/or detecting devices on the packaged device. In alternative embodiments, a die can have more than two sets of light emitting and detecting devices 403 formed on its surface. Correspondingly, the electronic substrate to which the packaged device is attached can have an aperture for each of the set of devices. The shapes and sizes of the apertures can vary depending upon the size and shape of the sets of devices to be exposed. In some embodiments, a single aperture expose more than one set of light emitting and/or sensing devices through the electrical substrate. Also, in some embodiments a liner material can be used to coat the aperture in the substrate so that certain light refraction or reflection effects can be controlled.

Figure 5:
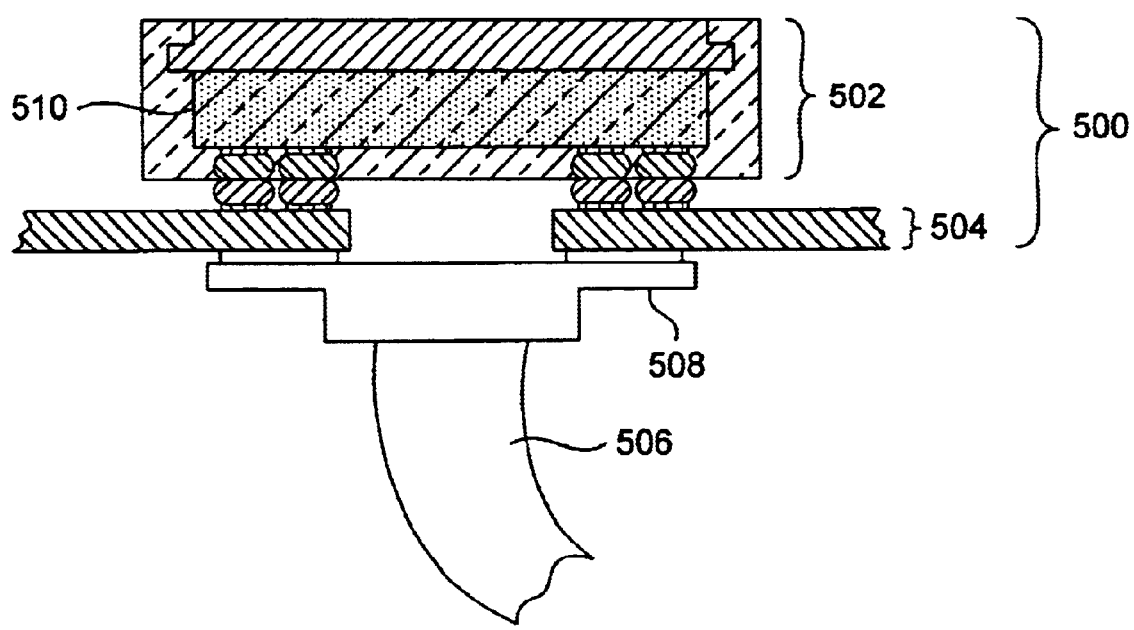
FIG. 5 illustrates a side-plan, cross-sectional view of an embodiment of the optoelectronic apparatus of the present invention that is used in an optical signal transmission application.

FIG. 5 illustrates a side-plan, cross-sectional view of an embodiment of the optoelectronic apparatus 500 of the present invention that is used in an optical signal transmission application. Optoelectronic apparatus 500 includes packaged device 502 and electronic substrate 504, as discussed previously. An optical fiber 506 is attached to electronic substrate 504 using connector 508 such that optical fiber 506 is in optical communication with the light emitting and/or detecting devices formed on semiconductor die 510. Packaged device 502 can serve as an optoelectronic transmitter, detector or transceiver. The optoelectronic apparatus 500 can be used in devices such as routers, switches, and cameras. In alternative embodiments, a device package can have multiple sets of light emitting and/or detecting devices and correspondingly be connected to multiple optical fibers. Also, a single substrate can be mounted with multiple packaged devices and multiple optical fibers.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An optical and electrical apparatus comprising:
    a packaged integrated circuit that includes,
        an integrated circuit having a first surface and a second surface, the first surface having a first set of light emitting or sensing devices and a plurality of bond pads;
        a conductive bump formed on each of the respective bond pads;
        a clear molding material that encapsulates the integrated circuit and a portion of each conductive bump such that each conductive bump is partially exposed through the clear molding material, whereby light can pass through the clear molding material and reach the first set of light emitting or sensing devices; and
    an electrical substrate having a plurality of electrical contact points and a first aperture wherein the packaged integrated circuit is positioned together with the electrical substrate wherein at least some of the conductive bumps are connected to respective electrical contact points and wherein the first aperture is located over the first set of light emitting or sensing devices.

2. An optical and electrical apparatus as recited in claim 1 wherein the integrated circuit further comprises a second set of light emitting or sensing devices and the electrical substrate further comprises a second aperture wherein the second aperture is located over the second set of light emitting or sensing devices.

3. An optical and electrical apparatus as recited in claim 1 further comprising an optical fiber that is attached to the electrical substrate in a position over the first aperture such that the first set of light emitting or sensing devices is in optical communication with the optical fiber through the aperture of the electrical substrate.

4. An optical and electrical apparatus as recited in claim 1 further comprising a metal pad that is attached to the second surface of the integrated circuit wherein the metal pad is partially encapsulated by the clear molding material.

5. An optical and electrical apparatus as recited in claim 1 wherein the metal pad has locking ledges extending from the peripheral edges of the metal pad, whereby the locking ledges serve to lock the metal pad within the clear molding material.

6. An optical and electrical apparatus as recited in claim 1 wherein the electrical substrate is a printed circuit board.

7. An optical and electrical apparatus as recited in claim 1 wherein solder material is used to secure the connection between the conductive bumps and the electrical contact points.

8. An optical and electrical apparatus comprising:
    a packaged integrated circuit that includes,
        an integrated circuit having a first surface and a second surface, the first surface having a first and second set of light emitting or sensing devices and a plurality of bond pads;
        a conductive bump formed on each of the respective bond pads;
        a clear molding material that encapsulates the integrated circuit and a portion of each conductive bump such that each conductive bump is partially exposed through the clear molding material, whereby light can pass through the clear molding material and reach the first set of light emitting or sensing devices; and
    an electrical substrate having a plurality of electrical contact points and a first and second aperture wherein the packaged integrated circuit is positioned on the electrical substrate wherein at least some of the conductive bumps are connected to respective electrical contact points and wherein the first and second apertures are located respectively over the first and second set of light emitting or sensing devices.

9. An optical and electrical apparatus as recited in claim 8 further comprising an optical fiber that is attached to the electrical substrate in a position over the first aperture such that the first set of light emitting or sensing devices is in optical communication with the optical fiber through the aperture of the electrical substrate.

10. An optical and electrical apparatus as recited in claim 8 further comprising a metal pad that is attached to the second surface of the integrated circuit wherein the metal pad is partially encapsulated by the clear molding material.

11. An optical and electrical apparatus as recited in claim 8 wherein the metal pad has locking ledges extending from the peripheral edges of the metal pad, whereby the locking ledges serve to lock the metal pad within the clear molding material.

12. An optical and electrical apparatus as recited in claim 8 wherein the electrical substrate is a printed circuit board.

13. An optical and electrical apparatus as recited in claim 8 wherein solder material is used to secure the connection between the conductive bumps and the electrical contact points.

* * * * *

UNITED STATES PATENT AND TRADEMARK OFFICE
CERTIFICATE OF CORRECTION

PATENT NO. : 6,707,148 B1  Page 1 of 1
DATED : March 16, 2004
INVENTOR(S) : Shahram Mostafazadeh et al.

It is certified that error appears in the above-identified patent and that said Letters Patent is hereby corrected as shown below:

Title page,
Item [12], please change "Shahram Mostafazedeh" to -- Shahram Mostafazadeh --
Item [75], Inventor, please change "Shahram Mostafazedeh" to -- Shahram Mostafazadeh --.

Signed and Sealed this

Twelfth Day of April, 2005

JON W. DUDAS
*Director of the United States Patent and Trademark Office*